United States Patent
Yoon et al.

(10) Patent No.: US 11,653,524 B2
(45) Date of Patent: May 16, 2023

(54) DISPLAY DEVICE INCLUDING OPENING HAVING PROTRUDED PORTION AND DEPRESSED PORTION

(71) Applicant: SAMSUNG DISPLAY CO., LTD., Yongin-si (KR)

(72) Inventors: Seung Ho Yoon, Hwaseong-si (KR); Woo Yong Sung, Seoul (KR); Won Je Cho, Osan-si (KR); Won Woo Choi, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 78 days.

(21) Appl. No.: 17/215,897

(22) Filed: Mar. 29, 2021

(65) Prior Publication Data

US 2021/0217993 A1  Jul. 15, 2021

Related U.S. Application Data

(63) Continuation of application No. 16/223,958, filed on Dec. 18, 2018, now Pat. No. 10,964,910.

(30) Foreign Application Priority Data

Feb. 5, 2018 (KR) .......................... 10-2018-0013882

(51) Int. Cl.
*H01L 51/52* (2006.01)
*H01L 51/00* (2006.01)
(Continued)

(52) U.S. Cl.
CPC ...... *H01L 51/5253* (2013.01); *H01L 27/3244* (2013.01); *H01L 27/3258* (2013.01);
(Continued)

(58) Field of Classification Search
CPC .................................................... H01L 51/5253
See application file for complete search history.

(56) References Cited

U.S. PATENT DOCUMENTS

| 9,458,264 B2 | 10/2016 | Aoshima et al. |
| 9,632,487 B2 * | 4/2017 | Kim ............... H01L 27/326 |

(Continued)

FOREIGN PATENT DOCUMENTS

| JP | 2008-173838 | 7/2008 |
| JP | 2013-075430 | 4/2013 |

(Continued)

OTHER PUBLICATIONS

Office Action Dated Jul. 28, 2020 in Corresponding U.S. Appl. No. 16/223,958.

(Continued)

*Primary Examiner* — Caleb E Henry
(74) *Attorney, Agent, or Firm* — F. Chau & Associates, LLC

(57) ABSTRACT

A display device includes a substrate including a plastic layer, a barrier layer, and a display area in which an image is displayed. The display device further includes a light-emitting diode disposed in the display area, a planarization layer, and a pixel definition layer. The planarization layer and the pixel definition layer overlap the light-emitting diode. The display device further includes a thin film encapsulation layer disposed on the pixel definition layer. The thin film encapsulation layer includes at least one inorganic layer. The display device further includes an opening disposed in the display area and penetrating the substrate. The opening includes a protruded portion and a depressed portion, and the barrier layer overlaps at least one of the pixel definition layer and the planarization layer at the protruded portion.

22 Claims, 13 Drawing Sheets

(51) Int. Cl.
   *H01L 27/32*     (2006.01)
   *H01L 51/56*     (2006.01)
(52) U.S. Cl.
   CPC .......... *H01L 51/0097* (2013.01); *H01L 51/56*
       (2013.01); *H01L 27/326* (2013.01); *H01L*
           *2227/323* (2013.01); *H01L 2251/5338*
                                          (2013.01)

(56) References Cited

U.S. PATENT DOCUMENTS

| | | | | |
|---|---|---|---|---|
| 9,793,334 | B2* | 10/2017 | Park | H01L 27/3276 |
| 10,197,875 | B2 | 2/2019 | Koide | |
| 10,403,645 | B2* | 9/2019 | Namkung | H01L 51/5256 |
| 10,497,900 | B2* | 12/2019 | Choi | H01L 51/5253 |
| 10,615,369 | B2* | 4/2020 | Choi | H01L 51/0097 |
| 10,629,845 | B2* | 4/2020 | Kim | H01L 27/3276 |
| 10,833,291 | B2* | 11/2020 | Park | H01L 51/5253 |
| 2007/0090457 | A1* | 4/2007 | Lee | H01L 27/12 438/149 |
| 2014/0361262 | A1* | 12/2014 | Kim | G09G 3/035 257/40 |
| 2015/0144934 | A1 | 5/2015 | Rappoport et al. | |
| 2016/0104756 | A1* | 4/2016 | Lee | H01L 27/3276 257/40 |
| 2016/0190389 | A1* | 6/2016 | Lee | A61B 5/0077 438/28 |
| 2016/0202515 | A1* | 7/2016 | Watanabe | G02F 1/1339 349/190 |
| 2016/0285044 | A1* | 9/2016 | Park | H01L 27/3276 |
| 2016/0351645 | A1 | 12/2016 | You et al. | |
| 2016/0363909 | A1 | 12/2016 | Kang et al. | |
| 2017/0031323 | A1* | 2/2017 | Kim | H01L 27/3258 |
| 2017/0148856 | A1* | 5/2017 | Choi | H01L 27/3258 |
| 2017/0288004 | A1* | 10/2017 | Kim | H01L 51/5246 |
| 2018/0159086 | A1* | 6/2018 | Cho | H01L 51/5281 |
| 2018/0337223 | A1* | 11/2018 | Lee | H01L 27/3276 |
| 2019/0245160 | A1 | 8/2019 | Yoon et al. | |
| 2020/0067017 | A1* | 2/2020 | Seo | H01L 51/5256 |
| 2020/0105859 | A1* | 4/2020 | Lee | H01L 27/1244 |

FOREIGN PATENT DOCUMENTS

| | | |
|---|---|---|
| JP | 2015-035415 | 2/2015 |
| JP | 2016-112831 | 6/2016 |
| JP | 2018-017987 | 2/2018 |
| KR | 1020120062191 | 6/2012 |
| KR | 1020140137950 | 12/2014 |
| KR | 1020170059864 | 5/2017 |
| KR | 1020170063326 | 6/2017 |

OTHER PUBLICATIONS

Notice of Allowance Dated Nov. 23, 2020 in Corresponding U.S. Appl. No. 16/223,958.
Office Action Dated Jun. 21, 2022 in Corresponding Japanese Patent Application No. 10-2018-0013882.
Office Action Dated Jul. 19, 2022 In Corresponding Korean Patent Application No. 10-2018-0013882.

* cited by examiner

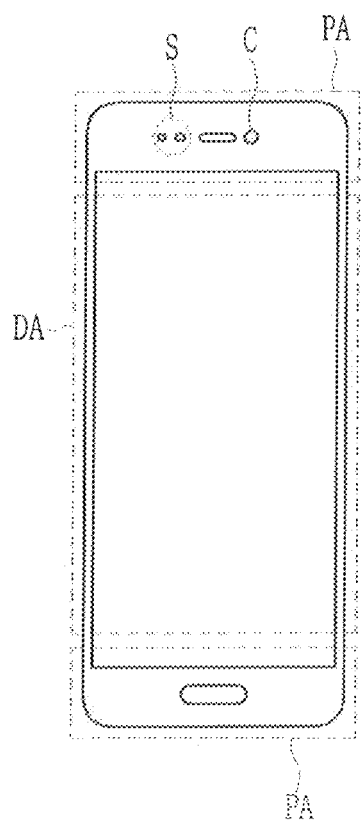

DISPLAY DEVICE INCLUDING OPENING HAVING PROTRUDED PORTION AND DEPRESSED PORTION

CROSS-REFERENCE TO RELATED APPLICATIONS

This application is a continuation application of U.S. patent application Ser. No. 16/223,958 filed Dec. 18, 2018, which claims priority under 35 U.S.C. § 119 to Korean Patent Application No. 10-2018-0013882 filed on Feb. 5, 2018, the disclosures of which are incorporated by reference herein in their entirety.

TECHNICAL FIELD

Exemplary embodiments of the present invention relate to a display device and a manufacturing method thereof.

DISCUSSION OF THE RELATED ART

A light emitting diode is an element used in display devices in which holes supplied from an anode and electrons supplied from a cathode are combined in an organic emission layer to form excitons. Light is emitted while the excitons are stabilized.

Light emitting diodes provide several advantages such as a wide viewing angle, a fast response speed, a reduced thickness, and low power consumption. As a result, light emitting diodes are widely used in various electronic devices such as televisions, computer monitors, mobile phones, etc.

A recent trend relating display devices used in mobile phones is an increase in the size of the display area and a decrease in the size of the non-display area surrounding the display area. As a result, certain modules, such as a camera sensor, that have previously been disposed in the non-display area may instead be disposed in the display area.

SUMMARY

Exemplary embodiments of the present invention provide a display device in which an opening into which a module such as a camera is inserted is positioned in a display area, such that the display area is enlarged. Also, a display device in which penetration of external air or moisture through the opening is prevented or reduced is provided. Further, a manufacturing method of such a display device is provided.

A display device according to an exemplary embodiment of the present invention includes a substrate including a plastic layer, a barrier layer, and a display area in which an image is displayed. The display device further includes a light-emitting diode disposed in the display area, a planarization layer, and a pixel definition layer. The planarization layer and the pixel definition layer overlap the light-emitting diode. The display device further includes a thin film encapsulation layer disposed on the pixel definition layer. The thin film encapsulation layer includes at least one inorganic layer. The display device further includes an opening disposed in the display area and penetrating the substrate. The opening includes a protruded portion and a depressed portion, and the barrier layer overlaps at least one of the pixel definition layer and the planarization layer at the protruded portion.

In an exemplary embodiment, the light-emitting diode includes a pixel electrode connected to a transistor, a common electrode overlapping the pixel electrode, and an emission layer disposed between the pixel electrode and the common electrode. The emission layer is disposed at the protruded portion.

In an exemplary embodiment, the emission layer disposed at the protruded portion includes at least two organic materials that emit light of different colors from each other.

In an exemplary embodiment, the emission layer has a disconnected shape along an external circumferential surface of the opening.

In an exemplary embodiment, the inorganic layer is disposed at an external circumferential surface of the opening.

In an exemplary embodiment, the inorganic layer includes at least two layers.

In an exemplary embodiment, an ultraviolet (UV) transmittance of the plastic layer is lower than a UV transmittance of the barrier layer.

In an exemplary embodiment, the plastic layer and the barrier layer are alternately stacked at least twice, and the opening includes at least one additional protruded portion.

In an exemplary embodiment, the protruded portion and the at least one additional protruded portion are differentiated by a protrusion degree.

In an exemplary embodiment, a protrusion degree of the protruded portion and the at least one additional protruded portion increases as a distance from the light-emitting diode increases.

According to an exemplary embodiment of the present invention, a display device includes a substrate including a plastic layer, a barrier layer, and a display area in which an image is displayed. The display device further includes a transistor disposed in the display area and including a gate electrode, a source electrode, and a drain electrode. The display device further includes a pixel electrode connected to the transistor, an emission layer overlapping the pixel electrode, and an opening disposed in the display area and penetrating the substrate. The opening includes a protruded portion and a depressed portion. The barrier layer disposed in the protruded portion overlaps a metal auxiliary layer disposed at a same layer as at least one of the gate electrode, the source electrode, and the pixel electrode.

In an exemplary embodiment, the display device further includes a buffer layer disposed between the substrate and the gate electrode, a semiconductor layer disposed on the buffer layer, and a gate insulating layer disposed between the semiconductor layer and the gate electrode.

In an exemplary embodiment, at least one of the buffer layer and the gate insulating layer overlaps the metal auxiliary layer.

According to an exemplary embodiment of the present invention, a method of manufacturing a display device includes forming a pixel electrode connected to a transistor, a planarization layer, and a pixel definition layer on a substrate. The substrate includes a plastic layer and a barrier layer, and the planarization layer and the pixel definition layer overlap the pixel electrode. The method further includes forming an opening penetrating the substrate and at least one of the pixel definition layer and the planarization layer. An external circumferential surface of the opening includes a protruded portion at which the barrier layer is protruded toward a center of the opening, and a depressed portion at which the plastic layer is recessed away from the center of the opening. The barrier layer overlaps at least one of the pixel definition layer and the planarization layer at the protruded portion.

In an exemplary embodiment, the opening is formed using a laser having an ultraviolet (UV) wavelength.

In an exemplary embodiment, a UV transmittance of the plastic layer is lower than a UV transmittance of the barrier layer.

In an exemplary embodiment, the method further includes forming an emission layer on the pixel definition layer. The protruded portion and the emission layer are overlapped.

In an exemplary embodiment, the method further includes forming a thin film encapsulation layer on the emission layer. The thin film encapsulation layer includes at least one inorganic layer, and the at least one inorganic layer is disposed on the external circumferential surface of the opening.

In an exemplary embodiment, the plastic layer and the barrier layer are alternately stacked.

In an exemplary embodiment, the external circumferential surface of the opening includes at least one additional protruded portion.

According to an exemplary embodiment of the present invention, a display device includes a substrate including a plastic layer and a barrier layer, a pixel electrode disposed on the substrate, a planarization layer disposed on the substrate, and a pixel definition layer disposed on the substrate. The planarization layer and the pixel definition layer overlap the pixel electrode. The display device further includes an opening penetrating the substrate and at least one of the pixel definition layer and the planarization layer. The opening includes a protruded portion disposed on an external circumferential surface of the opening, and a depressed portion formed on the external circumferential surface. The barrier layer overlaps at least one of the pixel definition layer and the planarization layer at the protruded portion.

In an exemplary embodiment, the protruded portion protrudes in a direction toward a center of the opening, and the depressed portion is recessed in a direction away from the center of the opening.

In an exemplary embodiment, the barrier layer is protruded toward the center of the opening at the protruded portion, and the plastic layer is recessed away from the center of the opening at the depressed portion.

In an exemplary embodiment, the display device further includes an emission layer disposed on the pixel definition layer. The emission layer is disconnected along the external circumferential surface of the opening.

According to exemplary embodiments of the present invention, a display device in which the area of the display area is increased is provided. Also, a display device in which penetration of outside air or moisture through the opening is prevented or reduced is provided.

BRIEF DESCRIPTION OF THE DRAWINGS

The above and other features of the present invention will become more apparent by describing in detail exemplary embodiments thereof with reference to the accompanying drawings, in which:

FIG. 1A is a schematic view of a conventional display device.

DETAILED DESCRIPTION OF THE EXEMPLARY EMBODIMENTS

Figure 1B:
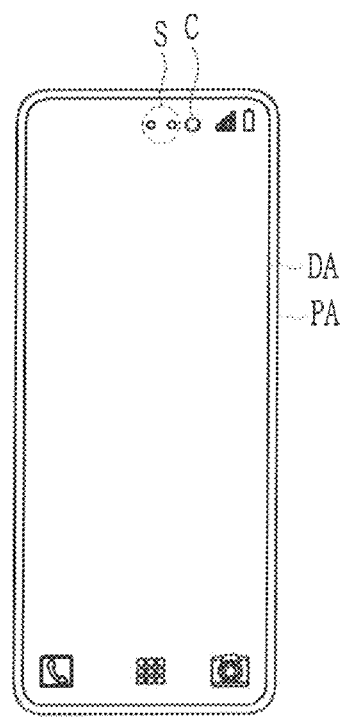
FIG. 1B is a schematic view of a display device according to an exemplary embodiment of the present invention.

Exemplary embodiments of the present invention will be described more fully hereinafter with reference to the accompanying drawings. Like reference numerals may refer to like elements throughout the accompanying drawings.

It will be understood that when an element such as a layer, film, region, or substrate is referred to as being "on" another element, it can be directly on the other element or intervening elements may also be present. It will also be understood that when an element is referred to as being "between" two elements, it can be the only element between the two elements, or one or more intervening elements may also be present. It will also be understood that when an element is referred to as "overlapping" another element, it can be the only element overlapping the other element, or one or more intervening elements may also be overlapping the other element.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below.

FIG. 1A is a schematic view of a conventional display device. FIG. 1B is a schematic view of a display device according to an exemplary embodiment of the present invention.

Referring to FIG. 1A, a conventional display device includes a display area DA in which an image is displayed, and a non-display area PA (also referred to as a peripheral area) enclosing the display area DA in which an image is not displayed. A module such as, for example, a camera C and a sensor S, is positioned in the non-display area PA.

Referring to FIG. 1B, in a display device according to an exemplary embodiment, most of a front side of the display device is the display area DA. For example, unlike the display device of FIG. 1A, the display area DA of the display device in FIG. 1B extends to a periphery of the front side of the display device. In the display device according to an exemplary embodiment, most of one surface of the display device is provided as the display area DA, and a relatively small part of the periphery of the display area DA is provided as the non-display area PA.

The display device according to an exemplary embodiment may include a module such as, for example, a camera C and a sensor S, positioned in the display area DA. For example, the module such as the camera C and the sensor S may be positioned in the display area DA in which the image is displayed.

Next, one pixel positioned in the display area, and an opening OP disposed adjacent to the one pixel and in which the module (e.g., the camera C, the sensor S, etc.) is inserted, are described with reference to FIG. 2 and FIG. 3.

Figure 2:
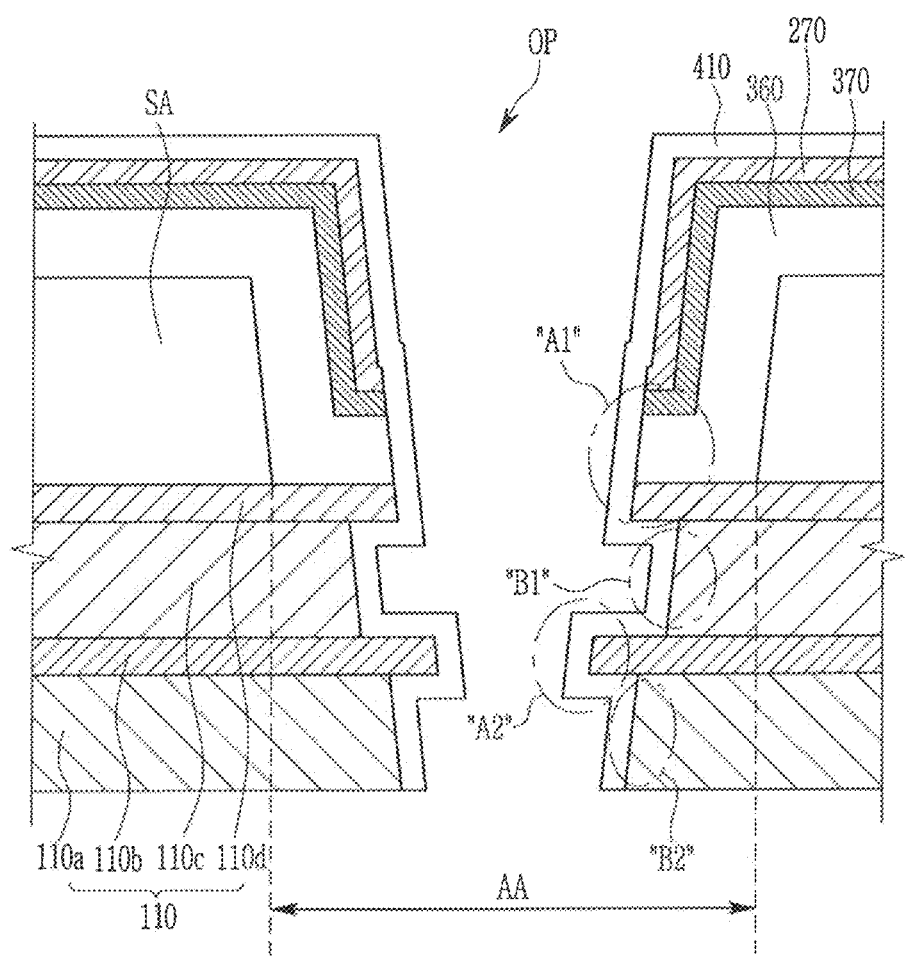
FIG. 2 is a cross-sectional view of a region disposed adjacent to an opening in which a module is inserted according to an exemplary embodiment of the present invention.

FIG. 2 is a cross-sectional view of a region disposed adjacent to an opening in which a module is inserted according to an exemplary embodiment of the present invention. FIG. 3 is a cross-sectional view of one pixel according to an exemplary embodiment (e.g., the exemplary embodiment of FIG. 2). Both the cross-sectional view of FIG. 2 and the cross-sectional view of FIG. 3 correspond to the display area DA.

Hereinafter, a region in which a stacking structure member SA including constituent elements positioned between a substrate 110 and a pixel definition layer 360 described later is partially removed in the display area DA in which the opening OP is disposed is referred to as an opening adjacent region AA.

In an exemplary embodiment, a diameter of an opening adjacent region AA is larger than a diameter of the opening OP. For example, in an exemplary embodiment, the diameter of the opening OP may be between about 1 mm and about 4 mm, and the diameter of the opening adjacent region AA may be the opening OP diameter±about 200 μm.

Referring to FIG. 2, a substrate 110 according to an exemplary embodiment may be, for example, a transparent insulation substrate including a polymer. The substrate 110 may be a flexible substrate.

In an exemplary embodiment, the substrate 110 includes a first plastic layer 110a, a first barrier layer 110b, a second plastic layer 110c, and a second barrier layer 110d. In the exemplary embodiment shown in FIG. 2, the substrate includes the plastic layer and the barrier layer that are alternately stacked two times. However, exemplary embodiments of the present invention are not limited thereto. For example, according to exemplary embodiments, a structure in which the plastic layer and the barrier layer are alternately stacked once, or a structure in which the plastic layer and the barrier layer are alternately stacked three times or more, may be included.

The first plastic layer 110a and the second plastic layer 110c may include, for example, polyimide, polyethylene naphthalate, polyethylene terephthalate (PET), polyarylate, polycarbonate, polyether Imide (PEI), polyethersulfone, etc.

The first plastic layer 110a and the second plastic layer 110c may allow moisture and oxygen to more easily permeate the display device compared to a glass substrate. To compensate for this, in an exemplary embodiment, the first barrier layer 110b is positioned on the first plastic layer 110a, and the second barrier layer 110d is positioned on the second plastic layer 110c.

The first barrier layer 110b and the second barrier layer 110d may include an inorganic material such as, for example, a metal oxide, a silicon nitride, a silicon oxide, etc. For example, the first barrier layer 110b and the second barrier layer 110d may include an inorganic material such as $AlO_3$, $SiO_x$, $SiN_x$, etc. Each of the first barrier layer 110b and the second barrier layer 110d may be a single layer or a multi-layer.

According to exemplary embodiments, the stacking structure member SA including the constituent elements positioned between the substrate 110 and the pixel definition layer 360 is not positioned in the opening adjacent region AA. According to exemplary embodiments, the stacking structure member SA includes a buffer layer 111, a transistor Tr, a pixel electrode 191, etc., as described in detail with reference to FIG. 3.

Referring again to FIG. 2, in an exemplary embodiment, the opening OP penetrates the substrate 110, the pixel definition layer 360, an emission layer 370, and a common electrode 270. A module such as, for example, the camera C or the sensor S described above may be inserted in the opening OP. For example, in exemplary embodiments, the opening OP fully penetrates the substrate 110, the pixel definition layer 360, the emission layer 370, and the common electrode 270. In exemplary embodiments, the opening OP penetrates the substrate 110 and at least one of the pixel definition layer 360 and a planarization layer 180 (see FIG. 3).

In an exemplary embodiment, an external circumferential surface of the opening OP includes protrusions and depressions. The external circumferential surface of the opening OP refers to the exposed surface of the opening OP within the opening OP. For example, in an exemplary embodiment, the pixel definition layer 360 and the barrier layers 110b and 110d include protruded portions A1 and A2 having a structure that is convex toward the inside (or center) of the opening OP. In an exemplary embodiment, the external circumferential surface of the opening OP includes depressed portions B1 and B2 in which the plastic layers 110a and 110c are formed to be concave compared to the barrier layers 110b and 110d. In exemplary embodiments, the barrier layers 110b and 110d overlap at least one of the pixel definition layer 360 and the planarization layer 180 (see FIG. 3) at the protruded portions A1 and A2.

In an exemplary embodiment, the depressed portion B1 included in the second plastic layer 110c has a shape that is over-etched compared to the depressed portion B2 of the first plastic layer 110a. In an exemplary embodiment, a size of the depressed portion B1 included in the second plastic layer 110c may be larger than the size of the depressed portion B2 included in the first plastic layer 110a.

Also, in an exemplary embodiment, the protruded portion A1 included in the second barrier layer 110d has a shape that is over-etched compared to the protruded portion A2 included in the first barrier layer 110b. For example, as shown in FIG. 2, the protruded portion A2 included in the first barrier layer 110b may have a shape that is protruded further toward the opening OP than the protruded portion A1 included in the second barrier layer 110d. In an exemplary embodiment, protruded portions may protrude more as the distance from the light emitting diode increases. For example, in an exemplary embodiment, a protrusion degree of the protruded portions increases as the distance from the light emitting diode increases. For example, protruded portions located further away from the light emitting diode protrude more toward the center of the opening (e.g., have an increased protrusion degree) compared to protruded portions located closer to the light emitting diode. In an exemplary embodiment, the protruded portions and the depressed portions are arranged repeatedly in a direction toward the substrate 110.

Referring to FIG. 2, in an exemplary embodiment, the protruded portions A1 and A2 and the depressed portions B1 and B2 are formed along the external circumferential surface of the opening OP. The protruded portions A1 and A2 protrude toward the center of the opening OP, and the depressed portions B1 and B2 are recessed away from the center of the opening OP. Thus, in an exemplary embodiment, the first barrier layer 110$b$ and the second barrier layer 110$d$ respectively formed at the second protruded portion A2 and the first protruded portion A1 protrude toward the center of the opening OP, and the first plastic layer 110$a$ and the second plastic layer 110$c$ respectively formed in the second depressed portion B2 and the first depressed portion B1 are recessed away from the center of the opening OP.

In an exemplary embodiment, the protruded portions protrude more toward the center of the opening OP in a direction toward the substrate 110. For example, in FIG. 2, the second protruded portion A2 protrudes toward the center of the opening OP more than the first protruded portion A1. For example, in an exemplary embodiment, the outermost surface of the second protruded portion A2 is located closer to the center of the opening OP than the outermost surface of the first protruded portion A1. That is, in an exemplary embodiment, the distance between opposing outermost surfaces of the first protruded portion A1 that face each other across the opening OP is greater than the distance between opposing outermost surfaces of the second protruded portion A2 that face each other across the opening OP, as shown in FIG. 2.

A laser used in a process that forms the opening OP may have a Gaussian shape. For example, the laser according to an exemplary embodiment may have a shape such that the width decreases closer to a lowest surface of the substrate 110. A protrusion degree of the plurality of protruded portions may be differentiated according to these shapes. For example, the plurality of protruded portions may protrude more as the protruded portions get closer to the lowest surface of the substrate 110. However, exemplary embodiments of the present invention are not limited thereto. For example, according to exemplary embodiments, the shape of the protruded portions and the depressed portions may be changed when using a laser of other shapes.

In an exemplary embodiment, on a plane, the size of the opening of the pixel definition layer 360 and the barrier layers 110$b$ and 110$d$ is smaller than the size of the opening of the plastic layers 110$a$ and 110$c$. An undercut may be formed between the barrier layers 110$b$ and 110$d$ and the plastic layers 110$a$ and 110$c$. In exemplary embodiments, the boundary between the plastic layers 110$a$ and 110$c$ and the opening OP has a shape that is separated from the center of the opening OP more than the boundary between the barrier layers 110$b$ and 110$d$ and the opening OP. For example, in an exemplary embodiment, the distance between opposing portions of the plastic layers 110$a$ and 110$c$ that face each other across the opening OP is greater than the distance between opposing portions of the barrier layers 110$b$ and 110$d$ that face each other across the opening OP. For example, in an exemplary embodiment, ends of the plastic layers 110$a$ and 110$c$ that face the opening OP are further from the opening than ends of the barrier layers 110$b$ and 110$d$ that face the opening.

The barrier layers 110$b$ and 110$d$ and the plastic layers 110$a$ and 110$c$ may have different ultraviolet (UV) wavelength transmittance from each other. For example, the transmittance of the plastic layers 110$a$ and 110$c$ for a UV wavelength may be lower than that of the barrier layers 110$b$ and 110$d$. For example, as the plastic layers 110$a$ and 110$c$ absorb a greater amount of UV light, they may be etched more than the barrier layers 110$b$ and 110$d$. Accordingly, the depressed portions B1 and B2 may be formed at the plastic layer 110$a$ and 110$c$, and the protruded portions A1 and A2 may be formed at the barrier layers 110$b$ and 110$d$.

In exemplary embodiments, the protruded portions A1 and A2 are formed in the region in which the barrier layers 110$b$ and 110$d$ are positioned. Thus, in an exemplary embodiment, the substrate 110 includes at least two barrier layers 110$b$ and 110$d$, and the opening OP includes at least two protruded portions A1 and A2 disposed in areas corresponding to the at least two barrier layers 110$b$ and 110$d$.

In exemplary embodiments, the protruded portion A1 included in the second barrier layer 110$d$ overlaps the pixel definition layer 360. The pixel definition layer 360 may prevent the end of the second barrier layer 110$d$ that forms the protruded portion A1 from being damaged.

In exemplary embodiments, the protruded portion A1 overlaps the emission layer 370 positioned adjacent to the opening OP. In an exemplary embodiment, the emission layer 370 may include an organic material, and may include at least two organic materials emitting light of different colors from each other. In an exemplary embodiment, the organic materials positioned at the region forming the image and emitting light of the different colors from each other may be stacked in a plurality of layers at the protruded portion A1. For example, at least one of an organic material emitting red light, an organic material emitting green light, and an organic material emitting blue light may be positioned.

In exemplary embodiments, the emission layer 370 has a disconnected shape at the opening OP. For example, if the emission layer 370 had a continuous shape extending along the protruded portions A1 and A2 and the depressed portions B1 and B2 in the opening OP, outside air or moisture may penetrate into the emission layer 370 through the opening OP. However, according to exemplary embodiments of the present invention, the protruded portions A1 and A2 and the depressed portions B1 and B2 are stably formed. As a result, the emission layer 370 has a disconnected shape at the opening OP (e.g., at the protruded portion A1 in the opening OP). For example, due to the protruded portions A1 and A2 and the depressed portions B1 and B2 being stably formed, the emission layer 370 is not continuously formed along the external circumferential surface of the opening OP (e.g., the emission layer 370 has a disconnected shape along the external circumferential surface of the opening OP). As a result, outside air or moisture may be prevented from penetrating through the emission layer 370.

According to exemplary embodiments, the emission layer 370 having a disconnected shape along the external circumferential surface of the opening OP refers to the emission layer 370 not being continuously formed and extending along the external circumferential surface of the opening OP.

Exemplary embodiments are described herein in which the protruded portion A1, and the pixel definition layer 360 and the emission layer 370, overlap. However, exemplary embodiments of the present invention are not limited thereto. For example, according to exemplary embodiments, a part of the constituent elements included in the later-described stacking structure member SA may be positioned at the protruded portion A1.

Figure 3:
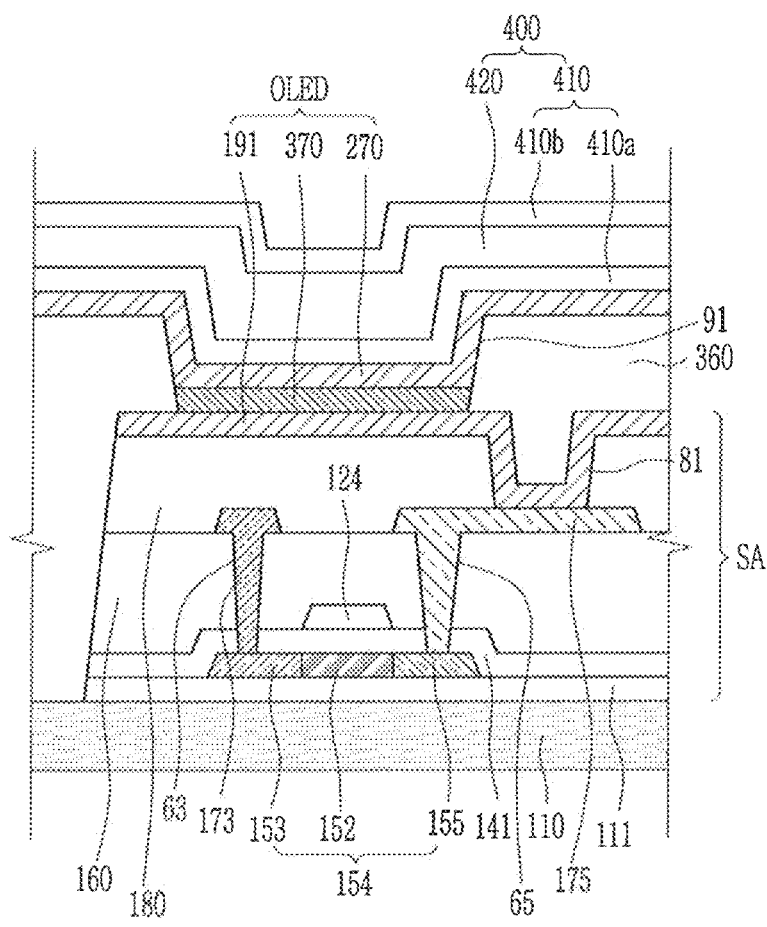
FIG. 3 is a cross-sectional view of one pixel according to an exemplary embodiment of the present invention.

Referring to FIG. 3, in an exemplary embodiment, a thin film encapsulation layer 400 includes an inorganic layer 410 and an organic layer 420. The inorganic layer 410 may include a first inorganic layer 410a and a second inorganic layer 410b. In this case, at least one of the first inorganic layer 410a and the second inorganic layer 410b may be positioned at the opening OP. According to an exemplary embodiment, both the first inorganic layer 410a and the second inorganic layer 410b are positioned at the opening OP. The first inorganic layer 410a and the second inorganic layer 410b may be represented as one layer including the same material.

In an exemplary embodiment, the inorganic layer 410 is positioned along the external circumferential surface of the opening OP. For example, the inorganic layer 410 may be positioned to enclose the entire external circumferential surface of the opening OP before the module is inserted into the opening OP. For example, the inorganic layer 410 may cover the entire external circumferential surface of the opening OP. The inorganic layer 410 may prevent outside air or moisture from penetrating through the opening OP.

Next, the stacking structure member SA and other constituent elements according to exemplary embodiments of the present invention are described in detail with reference to FIG. 3.

According to exemplary embodiments, the buffer layer 111 may be positioned on the above-described substrate 110, or the buffer layer 111 may be omitted. The buffer layer 111 may include an inorganic material such as, for example, a silicon oxide, a silicon nitride, etc. The buffer layer 111 may be a single layer or a multi-layer.

The buffer layer 111 may flatten one surface of the substrate 110 to planarize it, and may prevent an impurity from being diffused into a semiconductor layer 154 of the display device, or prevent the penetration of moisture into the display device, thus, preventing the degradation of the characteristics of the semiconductor layer 154.

The semiconductor layer 154 of the transistor Tr is positioned on the buffer layer 111. The semiconductor layer 154 includes a channel region 152, and a source region 153 and a drain region 155 positioned at respective sides of the channel region 152. The source region 153 and the drain region 155 are doped. The semiconductor layer 154 may include, for example, polysilicon, amorphous silicon, or an oxide semiconductor.

A light blocking electrode may be positioned between the substrate 110 and the semiconductor layer 154. The light blocking electrode prevents external light from reaching the semiconductor layer 154, thereby preventing deterioration of characteristics of the semiconductor layer 154 and reducing a leakage current of the transistor Tr.

A gate insulating layer 141 is positioned on the semiconductor layer 154. The gate insulating layer 141 may overlap the front surface of the substrate 110. The gate insulating layer 141 may include an inorganic insulating material such as, for example, a silicon oxide (SiOx), a silicon nitride (SiNx), etc.

A gate conductor including a gate electrode 124 of the transistor Tr is positioned on the gate insulating layer 141. The gate electrode 124 may overlap the channel region 152 of the semiconductor layer 154.

The gate conductor may include a metal such as, for example, molybdenum (Mo), copper (Cu), aluminum (Al), silver (Ag), chromium (Cr), tantalum (Ta), titanium (Ti), etc., or a metal alloy thereof. The gate conductor may be a single layer or a multi-layer.

An interlayer insulating layer 160 including the inorganic insulating material or the organic insulating material is positioned on the gate electrode 124.

A data conductor including a source electrode 173 and a drain electrode 175 of the transistor Tr, a data line, a driving voltage line, etc., is positioned on the interlayer insulating layer 160. The source electrode 173 and the drain electrode 175 may be respectively connected to the source region 153 and the drain region 155 of the semiconductor layer 154 through contact holes 63 and 65 formed in the interlayer insulating layer 160 and the gate insulating layer 141.

The data conductor may include a metal such as, for example, aluminum (Al), copper (Cu), silver (Ag), gold (Au), platinum (Pt), palladium (Pd), nickel (Ni), molybdenum (Mo), tungsten (W), titanium (Ti), chromium (Cr), tantalum (Ta), etc., or a metal alloy thereof. The data conductor may be a single layer or a multi-layer (e.g., Ti/Al/Ti, Mo/Al/Mo, Mo/Cu/Mo, etc.).

The gate electrode 124, the source electrode 173, and the drain electrode 175 form the transistor Tr along with the semiconductor layer 154. The transistor Tr may be, for example, a driving transistor in the pixel of the emissive display device. The transistor Tr may be referred to as a top-gate transistor, since the gate electrode 124 is positioned above the semiconductor layer 154. However, the structure of the transistor Tr is not limited thereto. For example, in exemplary embodiments, the transistor Tr may be a bottom-gate transistor in which the gate electrode is positioned below the semiconductor layer 154.

A planarization layer 180 is positioned on the interlayer insulating layer 160 and the data conductor. The planarization layer 180 removes and planarizes a step to increase emission efficiency of the organic light emitting element to be formed thereon. The planarization layer 180 may cover the transistor Tr.

The planarization layer 180 may include, for example, an organic insulating material. The organic insulating material may include, for example, polyimide, polyamide, polyacrylate, polyphenylene ether, polyphenylene sulfide, unsaturated polyester, an epoxy resin, phenol resin, etc. However, the planarization layer 180 is not limited thereto.

The pixel electrode 191 is positioned on the planarization layer 180. The pixel electrode 191 is connected to the drain electrode 175 of the transistor Tr through a contact hole 81 formed in the planarization layer 180.

The pixel electrode 191 may be formed of a reflective conductive material or a semi-transmissive conductive material, or may be formed of a transparent conductive material. For example, the pixel electrode 191 may include a transparent conductive material such as, for example, indium tin oxide (ITO) and indium zinc oxide (IZO), or a metal such as, for example, lithium (Li), calcium (Ca), aluminum (Al), silver (Ag), magnesium (Mg), and gold (Au).

The pixel definition layer 360 is positioned on the planarization layer 180 and the pixel electrode 191. The pixel definition layer 360 has an opening 91 overlapping a part of the pixel electrode 191. The opening 91 of the pixel definition layer 360 may limit the region corresponding to the pixel.

As described above, in exemplary embodiments, the pixel definition layer 360 overlaps the second barrier layer 110d in the protruded portion A1 included in the opening OP. A description of the pixel definition layer 360 in the region adjacent to the opening OP is omitted herein.

The pixel definition layer 360 may include an organic insulating material such as, for example, polyimide, polyacrylate, and polyamide.

The emission layer 370 is positioned on the pixel electrode 191. The emission layer 370 includes an emission region, and may additionally include at least one of a hole injection region, a hole transporting region, an electron injection region, and an electron transporting region.

The emission layer 370 may be made of the organic material uniquely emitting light of a primary color such as red, green, and blue, and may have a structure in which a plurality of organic materials emitting light of different colors are stacked.

As described above, in exemplary embodiments, the emission layer 370 is positioned at a region adjacent to the opening OP, and overlap the protruded portion A1. For convenience of explanation, a repeated description thereof is omitted.

The common electrode 270, which transmits a common voltage, is positioned on the emission layer 370. The common electrode 270 may include a transparent conductive material such as, for example, indium tin oxide (ITO) and indium zinc oxide (IZO). The common electrode 270 may formed by thinly laminating metals such as, for example, calcium (Ca), barium (Ba), magnesium (Mg), aluminum (Al), and silver (Ag), to have a light transmitting property. At least one protection layer or functional layer may be positioned on the common electrode 270.

The pixel electrode 191, the emission layer 370, and the common electrode 270 of each pixel form an organic light emitting diode (OLED) as the light emitting diode (LED). In an exemplary embodiment, the pixel electrode 191 may be an anode of the hole injection electrode, and the common electrode 270 may be a cathode of the electron injection electrode. In contrast, in an exemplary embodiment, the pixel electrode 191 may be the cathode and the common electrode 270 may be the anode. Holes and electrons are injected into the emission layer 370 from the pixel electrode 191 and the common electrode 270, respectively, and exitons generated by coupling the injected holes and electrons fall from an excited state to a ground state to emit light.

In exemplary embodiments, the thin film encapsulation layer 400 is positioned on the common electrode 270. The thin film encapsulation layer 400 may include a plurality of inorganic layers, and may include a structure in which an inorganic layer and an organic layer are alternately stacked. The thin film encapsulation layer 400 according to an exemplary embodiment includes the inorganic layer 410 and the organic layer 420. For example, the first inorganic layer 410*a*, the organic layer 420, and the second inorganic layer 410*b* that are sequentially stacked may be included in the thin film encapsulation layer 400. The thin film encapsulation layer 400 may include at least one sandwich structure in which at least one organic layer 420 is inserted between at least two inorganic layers 410*a* and 410*b*. However, the thin film encapsulation layer 400 is not limited thereto, and various other stacking structures may be implemented. The uppermost layer of the thin film encapsulation layer 400 (e.g., the layer exposed to the outside) may be the inorganic layer. As a result, moisture may be prevented from penetrating the light-emitting diode.

The inorganic layer 410 may include, for example, a metal oxide or a metal nitride. For example, the inorganic layer 410 may include any one of SiNx, $Al_2O_3$, $SiO_2$, and $TiO_2$.

The organic layer 420 may include a polymer. For example, the organic layer 420 may be formed by any one of polyethylene terephthalate, polyimide, polycarbonate, epoxy, polyethylene, and polyacrylate.

In the exemplary embodiments described herein, the thin film encapsulation layer 400 is positioned directly on the common electrode 270. However, exemplary embodiments of the present invention are not limited thereto. For example, in exemplary embodiments, a separate filler or adhesive may be positioned between the common electrode 270 and the thin film encapsulation layer 400.

Next, a display device according to an exemplary embodiment of the present invention will be described with reference to FIGS. 4 to 7.

Figure 4:
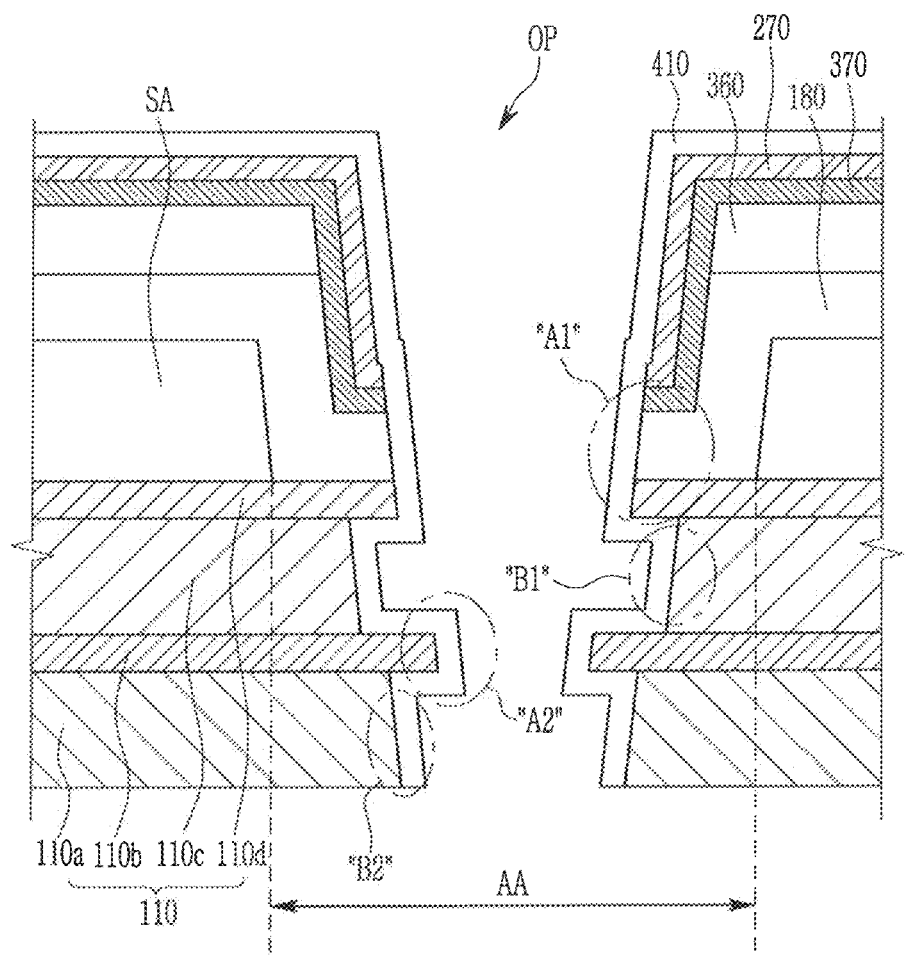
FIG. 4 is a cross-sectional view of a region disposed adjacent to an opening in which a module is inserted according to an exemplary embodiment of the present invention.
Figure 5:
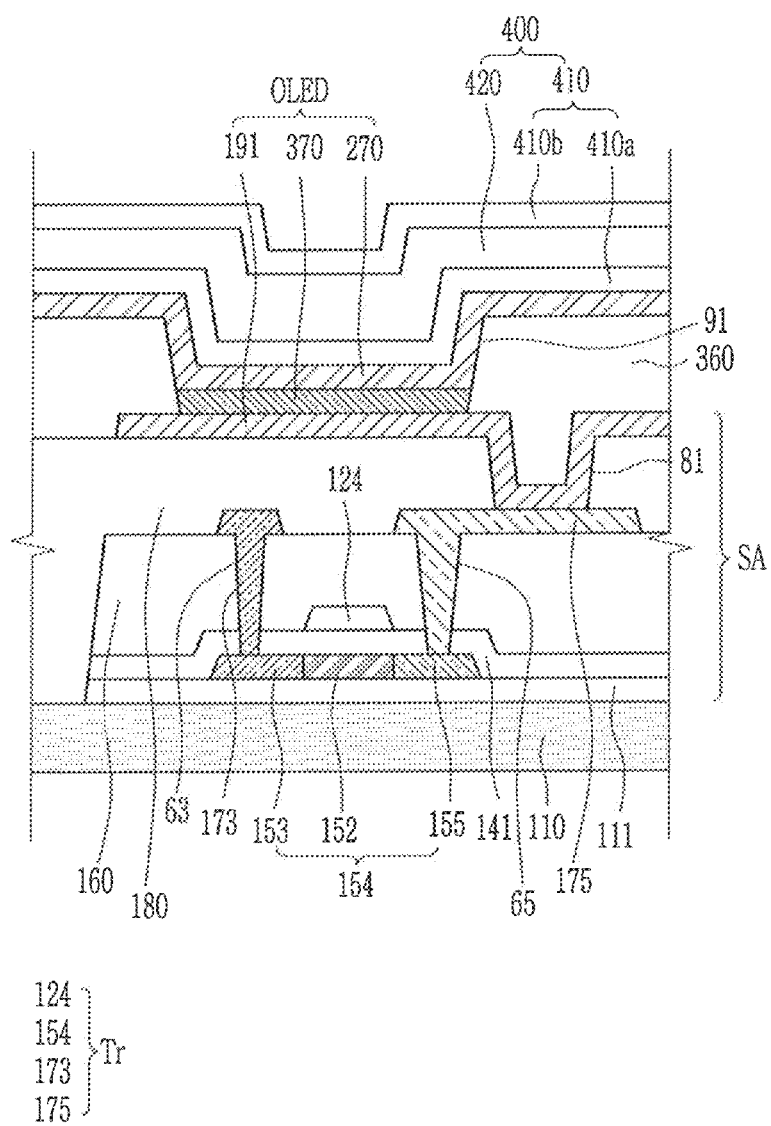
FIG. 5 is a cross-sectional view of one pixel according to the exemplary embodiment of FIG. 4.
Figure 6:
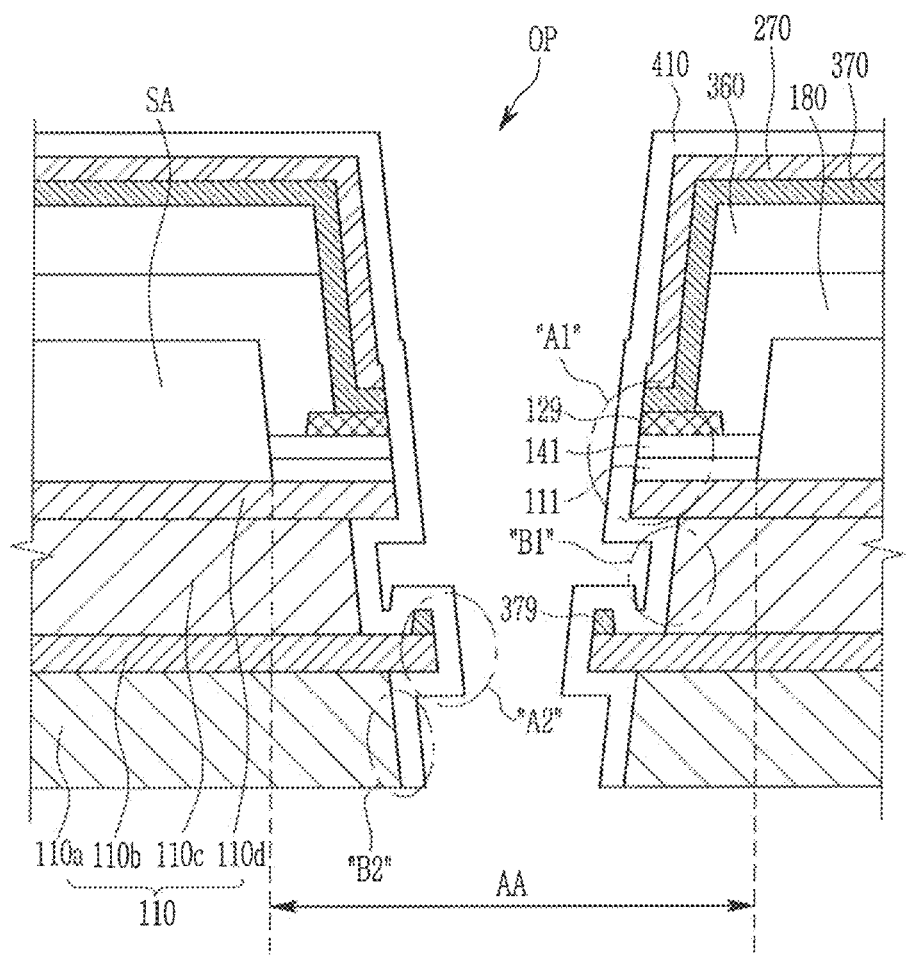
FIG. 6 is a cross-sectional view of a region disposed adjacent to an opening in which a module is inserted according to an exemplary embodiment of the present invention.
Figure 7:
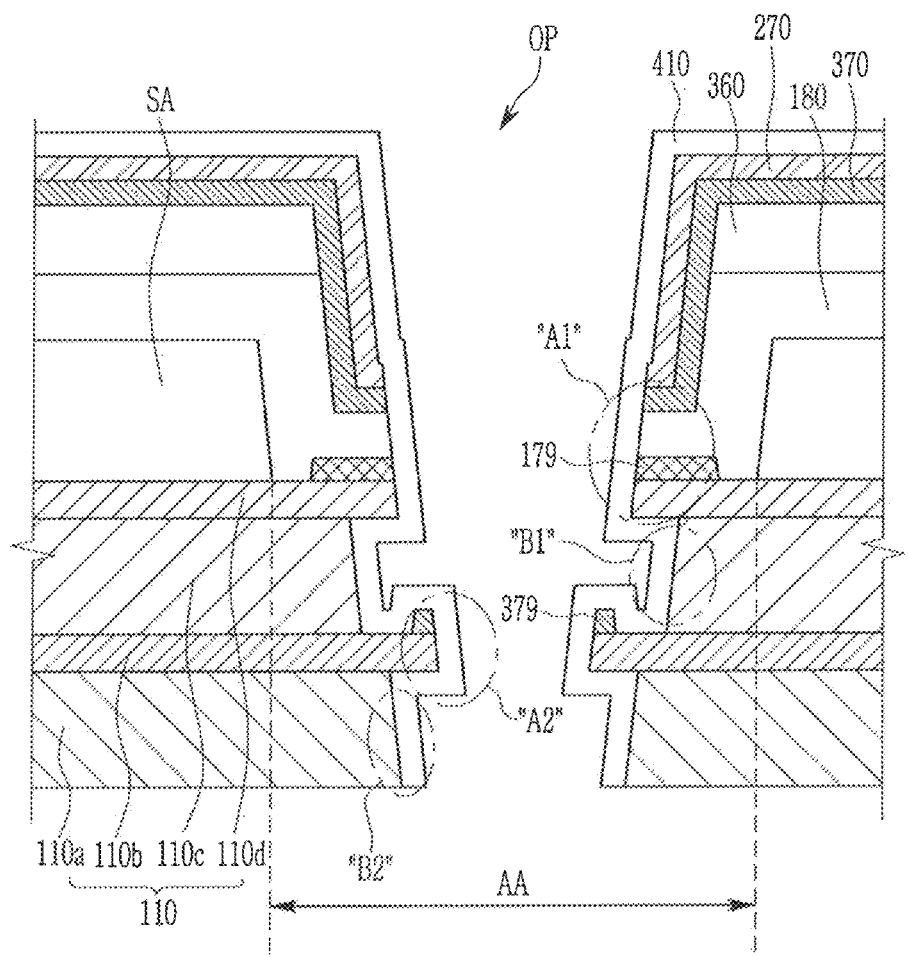
FIG. 7 is a cross-sectional view of a region disposed adjacent to an opening in which a module is inserted according to an exemplary embodiment of the present invention.

FIG. 4 is a cross-sectional view of a region disposed adjacent to an opening in which a module is inserted according to an exemplary embodiment of the present invention. FIG. 5 is a cross-sectional view of one pixel according to the exemplary embodiment of FIG. 4. FIG. 6 is a cross-sectional view of a region disposed adjacent to an opening in which a module is inserted according to an exemplary embodiment of the present invention. FIG. 7 is a cross-sectional view of a region disposed adjacent to an opening in which a module is inserted according to an exemplary embodiment of the present invention.

For convenience of explanation, a further description of elements and processes previously described with reference to FIGS. 2 and 3 may be omitted herein.

First, referring to FIGS. 4 and 5, in an exemplary embodiment, in the opening adjacent region AA in which the opening OP is positioned, the planarization layer 180 is positioned on the second barrier layer 110*d*. As shown in FIG. 5, in an exemplary embodiment, the planarization layer 180 has a shape that extends from the region overlapping the organic light emitting diode OLED to the region in which the opening OP is positioned. However, exemplary embodiments of the present invention are not limited thereto. For example, in exemplary embodiments, the planarization layer 180 has a shape that is separated at the region in which the organic light emitting diode OLED is positioned and the region in which the opening OP is positioned.

In exemplary embodiments, the planarization layer 180 includes the organic material. For example, the planarization layer 180 may include at least one of polyimide, polyamide, polyacrylate, polyphenylene ether, polyphenylene sulfide, unsaturated polyester, epoxy resin, and phenol resin. However, the planarization layer 180 is not limited thereto.

The planarization layer 180 overlapping the protruded portion A1 may protect the end of the second barrier layer 110*d* during the manufacturing process. In exemplary embodiments, the end of the second barrier layer 110*d* has a shape protruded toward the center of the opening OP while overlapping the planarization layer 180.

Next, referring to FIG. 6, in an exemplary embodiment, in the opening adjacent region AA, the buffer layer 111 and the gate insulating layer 141 are positioned on the second barrier layer 110*d*. Similar to as described above, the buffer layer 111 and the gate insulating layer 141 positioned in the region in which the pixel is positioned may have a shape that extends to the opening adjacent region AA in which the module is inserted.

In exemplary embodiments, a metal auxiliary layer 129 is positioned on the gate insulating layer 141 at the protruded portion A1. The metal auxiliary layer 129 may be positioned at the same layer as the gate conductor including the gate electrode 124. According to an exemplary embodiment, the metal auxiliary layer 129 may include the same material as the gate conductor, and may be formed in the same process.

In exemplary embodiments, the metal auxiliary layer 129 overlaps the second barrier layer 110*d*. The metal auxiliary layer 129 overlapping the second barrier layer 110*d* may prevent the end of the second barrier layer 110*d* from being damaged in the process of forming the opening OP. In addition, in exemplary embodiments, the undercut described above is stably formed between the second barrier layer 110*d* and the second plastic layer 110*c*, which may aid in preventing the end of the second barrier layer 110*d* from being damaged in the process of forming the opening OP.

In exemplary embodiments, edges of the metal auxiliary layer 129, the gate insulating layer 141, the buffer layer 111, and the second barrier layer 110*d* may be substantially aligned with one another.

In exemplary embodiments, at least one of the buffer layer 111 and the gate insulating layer 141 overlaps the metal auxiliary layer 129.

In exemplary embodiments, the metal auxiliary layer 129 is disposed at the same layer as at least one of the gate electrode 124, the source electrode 173, and the pixel electrode 191.

As shown in FIG. 6, in an exemplary embodiment, the emission layer 370 is positioned between the pixel definition layer 360 and the common electrode 270. Also, in an exemplary embodiment, a part 379 of the emission layer 370 may also be positioned at the end of the first barrier layer 110*b*. For example, in the process of forming the emission layer 370, the organic material forming the emission layer 370 may also be positioned on the opening OP. In this case, the part of the organic material may be positioned on the first barrier layer 110*b* protruded toward the center of the opening OP, thus, resulting in the part 379 of the emission layer 370 remaining at the end of the first barrier layer 110*b*.

According to an exemplary embodiment, even if the organic material forming the emission layer 370 is positioned on the opening OP (e.g., even if part 379 remains), the organic material positioned on the first barrier layer 110*b* and the organic material positioned on the second barrier layer 110*d* have the separated or disconnected shape. Accordingly, outside air or moisture may be prevented from penetrating through the elongated emission layer 370. For example, even if outside air or moisture penetrates through the small part 379 of the emission layer 370 positioned on the first barrier layer 110*b*, the elongated portion of the emission layer 370 positioned on the second barrier layer 110*d* is not affected due to the separated or disconnected shape.

Next, referring to FIG. 7, in an exemplary embodiment, in the opening adjacent region AA in which the opening OP is positioned, a metal auxiliary layer 179 is positioned on the second barrier layer 110*d*. An exemplary embodiment in which the metal auxiliary layer 179 is positioned directly on the second barrier layer 110*d* is shown in FIG. 7. However, exemplary embodiments of the present invention are not limited thereto. For example, in exemplary embodiments, at least one of the buffer layer 111 and the gate insulating layer 141 may be positioned between the second barrier layer 110*d* and the metal auxiliary layer 179.

In exemplary embodiments, the metal auxiliary layer 179 includes the same material as the data conductor or the same material as the pixel electrode 191. When the metal auxiliary layer 179 includes the same material as the data conductor, it may be formed in the same process as the manufacturing process of the data conductor. When the metal auxiliary layer 179 includes the same material as the pixel electrode 191, it may be formed in the same process as the manufacturing process of the pixel electrode 191.

Next, a manufacturing method of a display device according to an exemplary embodiment of the present invention will be described with reference to FIGS. 8 to 10.

Figure 8:
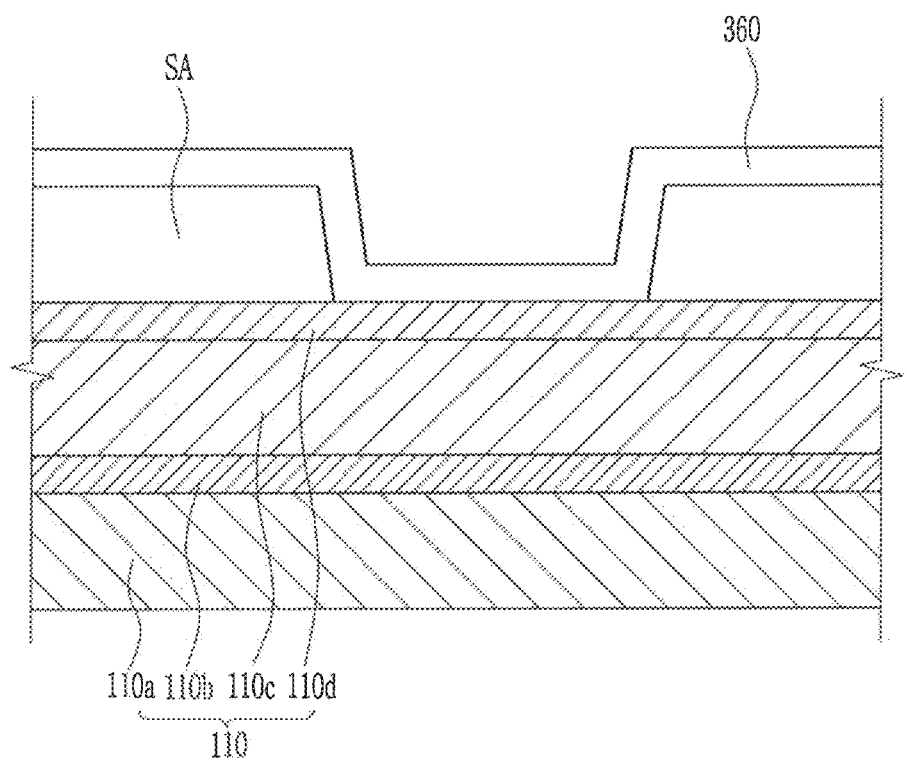
FIGS. 8 to 10 are cross-sectional views of a manufacturing method of a display device according to an exemplary embodiment of the present invention.
Figure 9:
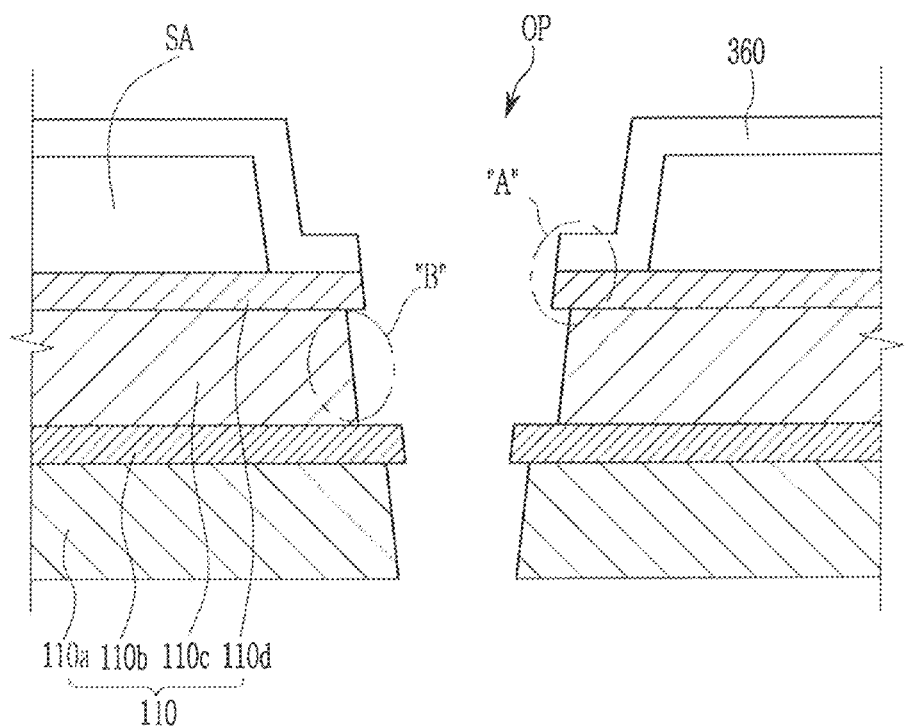
Figure 10:
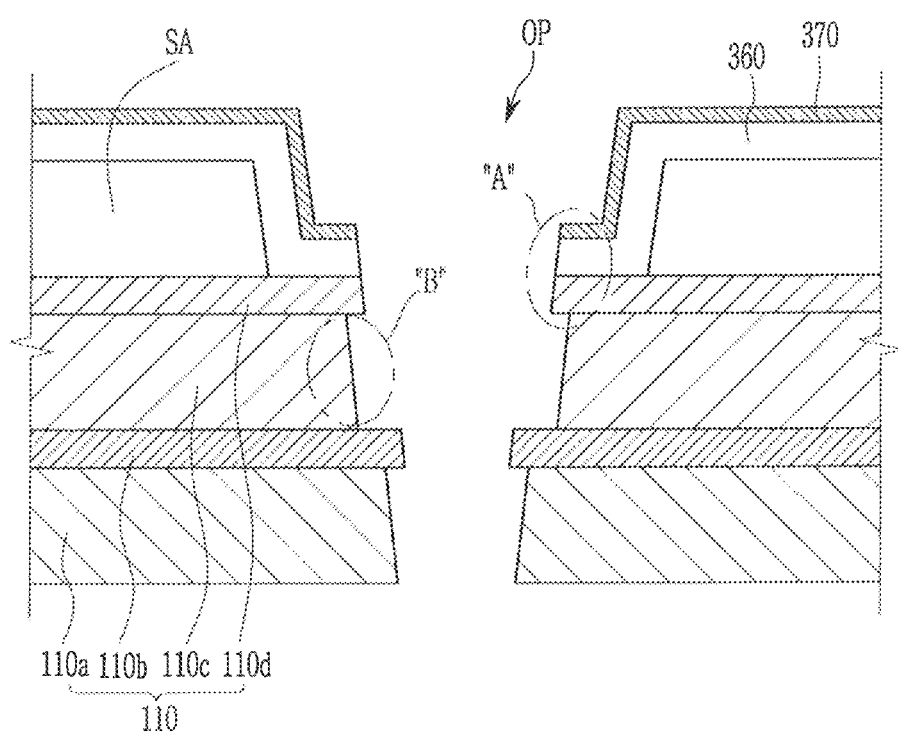

FIGS. 8 to 10 are cross-sectional views of a manufacturing method of a display device according to an exemplary embodiment of the present invention.

For convenience of explanation, a further description of elements and processes previously described may be omitted herein.

Referring to FIG. 8, the substrate 110 including the first plastic layer 110*a*, the first barrier layer 110*b*, the second plastic layer 110*c*, and the second barrier layer 110*d* is prepared. According to an exemplary embodiment, a carrier glass may be positioned at a rear surface of the substrate 110.

The stacking structure member SA including the transistor Tr and the pixel electrode 191 connected to the transistor Tr is formed on the substrate 110. The stacking structure member SA is not positioned in the region in which the opening OP is formed later. Then, the pixel definition layer 360 is formed to overlap the front side of the substrate 110.

Next, as shown in FIG. 9, the opening OP penetrating the pixel definition layer 360 and the substrate 110 is formed. The opening OP may be formed by a variety of methods. For example, in exemplary embodiments, a wet etching process, a dry etching process, a laser etching process, etc. may be used. For example, a laser etching process having a UV wavelength may be used.

In this case, the transmittance of the first plastic layer 110*a* and the second plastic layer 110*c* for a UV wavelength may be lower than the transmittance of the first barrier layer 110*b* and the second barrier layer 110*d*. The laser having a UV wavelength may over-etch the first plastic layer 110*a* and the second plastic layer 110*c* compared to the first barrier layer 110*b* and the second barrier layer 110*d*. The undercut may be positioned between the second barrier layer 110*d* and the second plastic layer 110*c* and between the first barrier layer 110*b* and the first plastic layer 110*a*.

Also, when using a predetermined laser, the etching degree of the second plastic layer 110*c* may be larger than the etching degree of the first plastic layer 110*a*. Similarly, the etching degree of the second barrier layer 110*d* may be larger than the etching degree of the first barrier layer 110*b*. Accordingly, the first plastic layer 110*a* may be positioned to be closer to the center of the opening OP compared to the second plastic layer 110*c*, and the first barrier layer 110*b* may also be positioned to be closer to the center of the opening OP compared to the second barrier layer 110*d*. The first plastic layer 110*a* and the first barrier layer 110*b* may have the protruded shape compared to the second plastic layer 110*c* and the second barrier layer 110*d*.

In exemplary embodiments, the opening OP has the protruded portion A at the region in which the first barrier layer 110*b* and the second barrier layer 110*d* are protruded, and has the depressed portion B at the region in which the over-etched first plastic layer 110*a* and second plastic layer 110*c* are positioned.

In exemplary embodiments, the protruded portion A in which the second barrier layer 110*d* is positioned overlaps the pixel definition layer 360. This results in a more stably formed protruded shape, as well as the prevention against damage that may occur due to the etching process. For example, when there is no overlapping, the end of the protruded second barrier layer 110*d* may be damaged by the laser used in the etching process. Thus, in exemplary embodiments, the end of the second barrier layer 110*d* overlaps the pixel definition layer 360, resulting in the prevention of damage that may occur due to the etching process, and resulting in a more stably formed protruded shape.

Next, as shown in FIG. 10, in exemplary embodiments, the emission layer 370 is formed on the pixel definition layer 360. Since the opening OP includes the protruded portion A and the depressed portion B, the emission layer 370 is not connected along the opening OP. For example, the emission layer 370 has a disconnected shape at the protruded portion A. For example, due to the inclusion of the protruded portion A and the depressed portion B, the emission layer 370 is not continuously formed along the external circumferential surface of the opening OP.

The emission layer 370 includes an organic material. Moisture may penetrate the emission layer 370 positioned adjacent to the opening OP. As a result, if the emission layer 370 has a continuous shape instead of a disconnected shape, the emission layer 370 forming the pixel may be damaged.

According to exemplary embodiments of the present invention, since the substrate 110 includes the stably formed protruded portion A and depressed portion B, the emission layer 370 including the organic material is not continuous, but rather, has a disconnected shape at the opening OP. As a result, moisture may be prevented from penetrating the light-emitting diode, thereby improving reliability.

According to exemplary embodiments, a part of the organic material forming the emission layer 370 may also be positioned at the end of the first barrier layer 110b in the process of forming the emission layer 370.

Next, the common electrode 270 is formed on the emission layer 370 and the thin film encapsulation layer 400 is formed, thereby providing the display device as shown, for example, in FIGS. 2 and 3.

The thin film encapsulation layer 400 according to an exemplary embodiment of the present invention may include the first inorganic layer 410a, the organic layer 420, and the second inorganic layer 410b. The organic layer 420 may be formed by a printing process according to an exemplary embodiment. The organic layer 420 is not positioned in the region adjacent to the opening OP according to an exemplary embodiment.

The inorganic layer 410 positioned at the opening OP may also include at least one of the first inorganic layer 410a and the second inorganic layer 410b. The inorganic layer 410 may include both of the first inorganic layer 410a and the second inorganic layer 410b. In exemplary embodiments in which first inorganic layer 410a and the second inorganic layer 410b include the same material, the layers are not divided into separate layers.

For convenience of explanation, only the manufacturing method for the exemplary embodiment of FIGS. 2 and 3 is described in detail herein. However, it is to be understood that the display device according to exemplary embodiments other than the exemplary embodiment of FIGS. 2 and 3 may also be manufactured through a similar method.

Next, the opening according to an exemplary embodiment of the present invention and a comparative example is described with reference to FIGS. 11 and 12.

Figure 11:
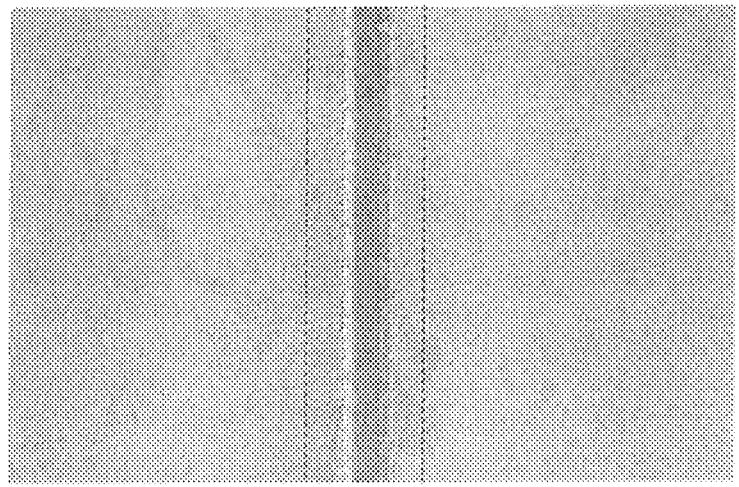
FIG. 11 is a view showing a plan image of an opening according to an exemplary embodiment of the present invention.
Figure 12:
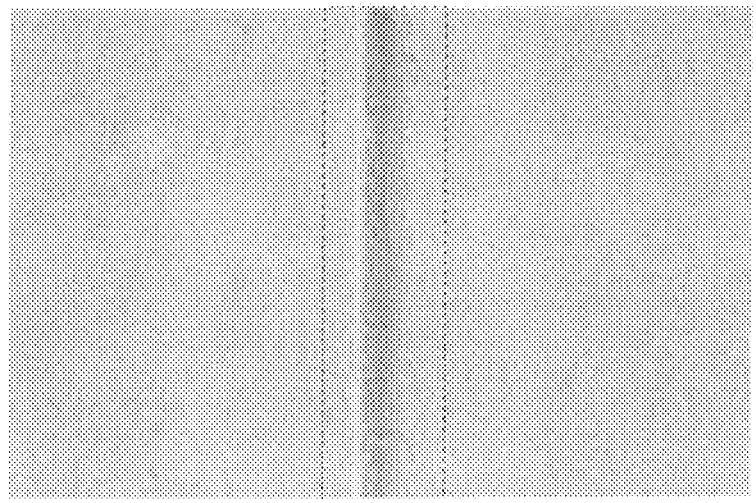
FIG. 12 is a view showing a plan image of an opening according to a comparative example.

FIG. 11 is a view showing a plan image of an opening according to an exemplary embodiment of the present invention. FIG. 12 is a view showing a plan image of an opening according to a comparative example.

Referring to FIG. 11, it can be seen that in an exemplary embodiment, the protruded portion is uniformly formed in the region adjacent to the opening. However, referring to FIG. 12, it can be seen that the inorganic layer is non-uniformly damaged such that the protruded portion is not stably formed.

When the protruded portion is not stably formed, the emission layer may be continuously formed along the external circumferential surface of the opening. As a result, outside air or moisture may penetrate through the emission layer positioned at the opening (e.g., exposed through the opening). The penetrating outside air or moisture may move along the emission layer, thereby damaging the emission layer positioned at the pixel area and lowering the display quality.

The display device according to exemplary embodiments of the present invention includes the opening, which includes the protruded portion and depressed portion stably formed thereon. The protruded portion is formed to have the protruded shape described herein such that damage does not occur through the pixel definition layer or the planarization layer positioned on the barrier layer, and such that damage does not occur through the metal auxiliary layer including the same material as one of the gate conductor, the data conductor, and the pixel electrode. In exemplary embodiments, the emission layer is disconnected in the opening, and is not continuously formed in the pixel area. Accordingly, damage of the light-emitting element positioned in the pixel area due to the penetration of outside air or moisture through the emission layer may be prevented or reduced.

While the present invention has been particularly shown and described with reference to the exemplary embodiments thereof, it will be understood by those of ordinary skill in the art that various changes in form and detail may be made therein without departing from the spirit and scope of the present invention as defined by the following claims.

What is claimed is:

1. A display device, comprising:
   a substrate comprising a first layer and a second layer;
   a light-emitting diode disposed on a display area of the substrate;
   an organic layer disposed between the substrate and the light-emitting diode;
   an encapsulation layer disposed on the light-emitting diode, wherein the encapsulation layer comprises at least one inorganic layer; and
   an opening disposed in the display area and penetrating the substrate,
   wherein the opening comprises a first protruded portion protruding toward a center of the opening and a first depressed portion, and
   wherein the first depressed portion is defined by a lower surface, an upper surface opposing the lower surface, and a side surface connecting the lower surface to the upper surface.

2. The display device of claim 1, wherein the first protruded portion and the first depressed portion are disposed in the substrate.

3. The display device of claim 1, wherein the first protruded portion is disposed in the second layer, and the first depressed portion is disposed in the first layer.

4. The display device of claim 1, wherein the first layer and the second layer are alternately stacked at least twice.

5. The display device of claim 4, wherein the opening comprises at least one additional protruded portion, and the first protruded portion and the at least one additional protruded portion are differentiated by a protrusion degree.

6. The display device of claim 4, wherein a protrusion degree of the first protruded portion and the at least one additional protruded portion increases as a distance from the light-emitting diode increases.

7. The display device of claim 1, wherein an ultraviolet (UV) transmittance of the first layer is lower than a UV transmittance of the second layer.

8. The display device of claim 1, wherein the first layer absorbs a greater amount of UV light than the second layer.

9. The display device of claim 1,
   wherein the organic layer comprises at least one of a planarization layer and a partition wall.

10. The display device of claim 9, wherein an end of at least one of a planarization layer and a partition wall overlaps the first protruded portion.

11. The display device of claim 9, wherein an end of at least one of the planarization layer and the partition wall is aligned with the first protruded portion.

12. The display device of claim 1, wherein the light-emitting diode comprises:
a first electrode connected to a transistor;
a second electrode overlapping the first electrode; and
an emission layer disposed between the first electrode and the second electrode,
wherein a part of the emission layer overlaps an end of the first protruded portion.

13. The display device of claim 12, wherein the emission layer includes at least one among a hole injection region, a hole transporting region, an electron injection region, and an electron transporting region.

14. The display device of claim 1, wherein the at least one inorganic layer defines the opening.

15. The display device of claim 14, wherein the at least one inorganic layer comprises at least two layers.

16. The display device of claim 1, wherein the opening further comprises:
a second protruded portion protruding toward the center of the opening; and
a second depressed portion disposed below the second protruded portion,
wherein the first depressed portion is disposed between the first and second protruded portions, and
wherein the first and second protruded portions are disposed closer to the center of the opening than the first and second depressed portions.

17. The display device of claim 16, wherein the second depressed portion, the second protruded portion, the first depressed portion, and the first protruded portion are sequentially arranged on the substrate in a direction extending away from the substrate, and the second protruded portion protrudes further toward the center of the opening than the first protruded portion.

18. A display device, comprising:
a substrate comprising a first layer and a second layer, and a display area in which an image is displayed;
a light-emitting diode disposed in the display area;
an encapsulation layer disposed on the light-emitting diode, wherein the thin film encapsulation layer comprises at least two inorganic layers; and
an opening disposed in the display area and penetrating the substrate,
wherein the first layer and the second layer are alternately stacked at least twice, and
a protruded portion is disposed in the second layer and a depressed portion is disposed in the first layer.

19. The display device of claim 18, wherein the display device comprises at least two of the protruded portions, and at least two of the protruded portions are differentiated by a protrusion degree.

20. The display device of claim 18, wherein the opening overlaps a module such as a camera or a sensor.

21. A display device, comprising:
a substrate comprising a first layer and a second layer;
a light-emitting diode disposed on a display area of the substrate;
an organic layer disposed between the substrate and the light-emitting diode;
an encapsulation layer disposed on the light-emitting diode, wherein the encapsulation layer comprises at least one inorganic layer; and
an opening disposed in the display area and penetrating the substrate,
wherein the opening comprises:
a first protruded portion protruding toward a center of the opening and a first depressed portion;
a second protruded portion protruding toward the center of the opening; and
a second depressed portion disposed below the second protruded portion,
wherein the first depressed portion is disposed between the first and second protruded portions, and
wherein the first and second protruded portions are disposed closer to the center of the opening than the first and second depressed portions.

22. The display device of claim 21, wherein the second depressed portion, the second protruded portion, the first depressed portion, and the first protruded portion are sequentially arranged on the substrate in a direction extending away from the substrate, and the second protruded portion protrudes further toward the center of the opening than the first protruded portion.

* * * * *